(12) United States Patent
Quan et al.

(10) Patent No.: US 7,692,508 B2
(45) Date of Patent: Apr. 6, 2010

(54) SPRING LOADED MICROWAVE INTERCONNECTOR

(75) Inventors: Clifton Quan, Arcadia, CA (US); David E. Roberts, San Pedro, CA (US); Shahrokh Hashemi-Yeganeh, Rancho Palos Verdes, CA (US); Richard A. Montgomery, San Pedro, CA (US)

(73) Assignee: Raytheon Company, Waltham, MA (US)

( * ) Notice: Subject to any disclaimer, the term of this patent is extended or adjusted under 35 U.S.C. 154(b) by 4 days.

(21) Appl. No.: 11/788,140

(22) Filed: Apr. 19, 2007

(65) Prior Publication Data

US 2008/0258848 A1   Oct. 23, 2008

(51) Int. Cl.
    *H01P 5/107* (2006.01)
(52) U.S. Cl. .............................. 333/1; 333/26; 333/33; 333/260; 439/700; 439/824
(58) Field of Classification Search .................. 333/260, 333/26, 33, 1; 439/700, 824
See application file for complete search history.

(56) References Cited

U.S. PATENT DOCUMENTS

| | | | |
|---|---|---|---|
| 4,052,683 A | 10/1977 | Van Heuven et al. | |
| 4,453,142 A | 6/1984 | Murphy | |
| 5,019,829 A * | 5/1991 | Heckman et al. | 343/700 MS |
| 6,002,305 A * | 12/1999 | Sanford et al. | 333/26 |
| 6,018,276 A * | 1/2000 | Hirota et al. | 333/26 |
| 6,144,266 A * | 11/2000 | Heidemann et al. | 333/26 |
| 6,265,950 B1 * | 7/2001 | Schmidt et al. | 333/26 |
| 6,639,364 B1 | 10/2003 | Woods et al. | |
| 6,639,486 B2 | 10/2003 | Buck | |
| 6,908,347 B2 * | 6/2005 | Sasaki | 439/824 |
| 6,957,986 B2 * | 10/2005 | Jing | 439/700 |
| 6,958,670 B2 * | 10/2005 | Winslow et al. | 333/260 |
| 6,998,944 B2 * | 2/2006 | Caplan et al. | 333/260 |
| 2007/0224889 A1 * | 9/2007 | Ito | 439/824 |

* cited by examiner

*Primary Examiner*—Benny Lee
*Assistant Examiner*—Alan Wong
(74) *Attorney, Agent, or Firm*—Christie, Parker & Hale, LLP

(57) ABSTRACT

A spring loaded microwave interconnector (SLMI). The SLMI includes a waveguide probe head having a first side and opposite thereto a second side, the sides transverse to a central axis. A spring loaded coax central conductor coupled to the probe head first side and provides a distal conductive tip. The coax central conductor extends along the central axis. A dielectric sleeve is disposed about the coax central conductor adjacent to the first side. The distal conductive tip extending beyond the dielectric sleeve when in an extended position and is about flush with the dielectric sleeve when in a compressed poison. An multiport waveguide to multiport PCB assembly utilizing a plurality of SLMIs wherein the multiport waveguide and PCB have curved contours is also disclosed.

34 Claims, 10 Drawing Sheets

SPRING LOADED MICROWAVE INTERCONNECTOR

FIELD

This invention relates generally to the field of radio frequency signal transmission, and more specifically to signal transmission between waveguides and printed circuit boards by way of interconnectors.

BACKGROUND

In electromagnetics and communications engineering, the term waveguide may refer to any linear structure that guides electromagnetic waves, however the most common and expected meaning is a hollow structure used to guide electromagnetic waves along from one point to another.

Waveguides are commonly employed in radar systems, antenna systems, or other similar systems as an effective means by which to guide gathered signal energy or transmission signal energy from one point in the system to another. For processing, either of the gathered signal or generation of the transmission signal, frequently a waveguide is coupled in one way or another to a printed circuit board ("PCB").

With the growing complexity of electrical systems that employ waveguides, such as for example radar systems, it is often desirable to fabricate different elements and/or subsystems on different circuit boards. Such separation of elements may reduce fabrication costs and permit fabrication flexibility, as well as enhance the opportunity for service and replacement of an element, should an improvement later be developed or a component malfunction.

Transferring energy between the waveguide and PCB typically involves interconnectors that are soldered, screwed, or otherwise semi permanent in attachment to the waveguide, the PCB or both. These semi permanent interconnections are typically cumbersome and must be installed in precise ways to insure proper operation.

Typically a technician will employ the use of a specialized solderer/welder or tools to establish the interconnection. As such, either the waveguide and the PCB must be brought to the attachment machine and tools or the attachment machine and tools must be brought to the PCB and waveguide.

In addition, the use of such a machine generally requires a degree of specialized training on the part of the technician. Even with such training there is a possibility of damaging the neighboring components, given the temperatures involved in welding/soldering such an interconnection in place. Repeated service upon such an interconnection and/or one or more of the interconnected boards generally requires the removal of such a welded/soldered interconnection, which may further impose stress upon the components.

As such, maintenance, especially field maintenance, is not always easily performed as a technician and/or the requisite tools and machines may not be available. Damage to a single interconnection may render the entire system, such as a radar system, inoperable—a condition highly undesirable and potentially costly in terms of human life and equipment loss.

Moreover, shortcomings abound with the types of interconnections typically employed. For example, coax cables are generally heavy and bulky—requiring specialized couplings and imposing load stress upon the assembly. Soldered pins or probes extending from the PCB for insertion into the waveguide are difficult to achieve in an array assembly. Slot coupled interconnections provide only narrow frequency bandwidth transmission. Microstrip probes are also difficult to provide in an array. Plated vias and Balun connections require two times the number of interconnections and thus increase fabrication costs and assembly complexity. Tapered ridge waveguides or tapered microstrips require very precise antenna depth positioning which again leads to difficult use in array assemblies.

In further addition, current limitations of interconnection options require that waveguide and PCB provide planar surfaces for the points of interconnection. Although planar surfaces can be and frequently are common, the use of curved surfaces may be highly desirable though currently unpractical due to interconnection limitations.

Hence, there is a need for a microwave interconnector that overcomes one or more of the technical problems and physical vulnerabilities common to contemporary waveguide to PCB interconnectors.

SUMMARY

This invention provides a spring loaded microwave interconnector.

In particular, and by way of example only, according to one embodiment of the present invention, provided is a spring loaded microwave interconnector (SLMI), including: a spring loaded conductor having a base and an actuating tip. The tip has an extended position and a compressed position. A first dielectric disposed about the conductor along a first dimension from the base to the compressed position of tip, the dielectric defining a second dimension transverse to the first dimension. A second dielectric is disposed adjacent to the base opposite from the first dielectric. The second dielectric and base each have a third dimension parallel to and less than or equal to the second dimension.

In another embodiment, provided is a spring loaded microwave interconnector assembly (SLMI), including: a dielectric sleeve circumferentially about a spring loaded coax central conductor. The coax central conductor provides an actuating tip at a first end and a probe head at a second end. A dielectric cap is coupled to the probe head opposite from the tip. The coax central conductor, probe head, dielectric sleeve and dielectric cap cooperatively interacting to provide a matched impedance transmission line between a PCB and a waveguide.

In yet another embodiment, provided is a spring loaded microwave interconnector (SLMI), including: a waveguide probe head having a first side and opposite thereto a second side, the sides transverse to a central axis. A spring loaded coax central conductor is coupled to the probe head first side and provides a distal conductive tip, the coax central conductor extending along the central axis. A dielectric sleeve disposed about the coax central conductor and adjacent to the first side. The distal conductive tip extends beyond the dielectric sleeve. A dielectric disc coupled to the second side of the waveguide probe head.

In another embodiment, provided is a waveguide to PCB interconnector assembly. This assembly includes a microwave waveguide having a first curving contour and an aperture provided in the first curving contour. There is also a microwave PCB having a second contour, the PCB adjacent to the waveguide and the second contour matching to at least a part of the first curving contour. The PCB provides a contact pad adjacent to the aperture. A spring loaded microwave interconnector (SLMI) is disposed in the aperture. The SLMI provides a self aligned probe head within the waveguide. The probe head is electrically coupled to a spring loaded coax central conductor having an actuating conductive tip in electrical contact with the contact pad.

Yet further, in another embodiment, provided is a waveguide to PCB interconnector assembly, including: a multiport waveguide assembly having a first contour, each port providing an aperture in the first contour. A multiport microwave PCB assembly having a second contour is adjacent to the waveguide assembly and at least a portion of the second contour matches at least a part of the first contour. Each port of the waveguide is paired to a port of the PCB assembly. A spring loaded microwave interconnector (SLMI) is disposed in each port aperture and interconnects a paired waveguide port and PCB port. Each spring loaded microwave interconnector includes; a waveguide probe head having a first side and opposite thereto a second side, the sides transverse to a central axis; a spring loaded coax central conductor coupled to the probe head first side and providing a conductive tip, the coax central conductor extending along the central axis; a dielectric sleeve disposed about the coax central conductor and adjacent to the first side, the spring loaded conductive tip extending beyond the dielectric sleeve; and a dielectric disc coupled to the second side of the waveguide probe head. Further, in one alternative embodiment, the first and second contours are flat. In yet another alternative embodiment, the first and second contours are curved.

DETAILED DESCRIPTION

Before proceeding with the detailed description, it is to be appreciated that the present teaching is by way of example only, not by limitation. The concepts herein are not limited to use or application with a specific system or method for a spring loaded microwave interconnector ("SLMI"). Thus, although the instrumentalities described herein are, for the convenience of explanation, shown and described with respect to exemplary embodiments, it will be appreciated that the principles herein may be applied equally in other types of systems and methods involving interconnector.

Figure 1:
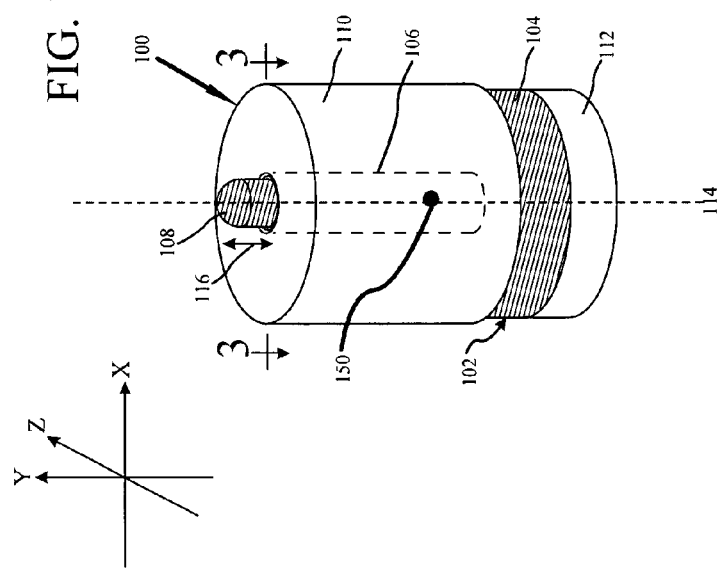
FIG. 1 is a perspective view of the spring loaded microwave interconnector in accordance with at least one embodiment.
Figure 2:
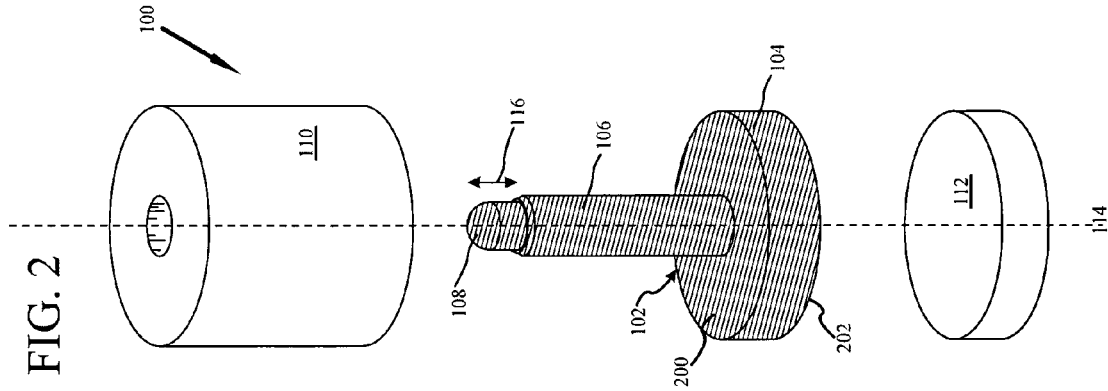
FIG. 2 is an exploded perspective view of the spring loaded microwave interconnector shown in FIG. 1.

Referring now to the drawings, and more specifically FIGS. 1~10, there is shown a spring loaded microwave interconnector (hereinafter "SLMI") 100 according to at least one embodiment. To facilitate the description of SLMI 100, the orientations of SLMI 100 as presented in the figures are referenced to the coordinate system with three axes orthogonal to one another as shown in FIGS. 1 and 2.

The axis intersect mutually at the origin of the coordinate system, which is chosen to locate at the center 150 of SLMI 100 (SLMI 100C as in the case of FIGS. 10~13). The axes shown in all figures are offset from their actual locations, for clarity and ease of illustration.

Shown in FIG. 1, SLMI 100 has a spring loaded conductor 102 having a base, more commonly referred to as a probe head 104, a spring loaded coax central conductor 106 and a distal conductive tip 108. In addition, SLMI 100 has a first dielectric 110 disposed about the central conductor 106 and a second dielectric 112 disposed adjacent to the base 104 opposite from the first dielectric 110. As shown, SLMI 100 is concentric about a longitudinal central axis 114. As illustrated in the figures, longitudinal central axis 114 is parallel to the Y-axis.

Actuation of the conductive tip 108 occurs along the Y-axis as shown by actuation arrows 116. As is more clearly shown in FIG. 3, conductive tip 108 has an extended position 350 and a compressed position 352. FIG. 2 provides an exploded view of SLMI 100 from the same perspective as FIG. 1 to further assist in appreciating the core elements of SLMI 100.

As shown, in at least one embodiment the first dielectric 110 is a dielectric sleeve and the second dielectric 112 is a disc. The spring loaded conductor 102 is also more clearly shown so as to appreciate the arrangement of the spring loaded coaxial central conductor 106, the conductive tip 108 and the probe head 104.

The probe head 104 is appreciated to be a conductive disc having a first side 200 and opposite thereto, a second side 202. The first and second sides 200, 202 are also appreciated to be transverse to the central axis 114. The spring loaded central conductor 106 is coupled to the probe head 104 such that together they provide a continuous conductive element. As shown, it is also appreciated that the spring loaded central conductor 106 extends from the probe head 104 along the central axis 114. Moreover, SLMI 100 is appreciated to be a symmetrical device about central axis 114.

Figure 3:
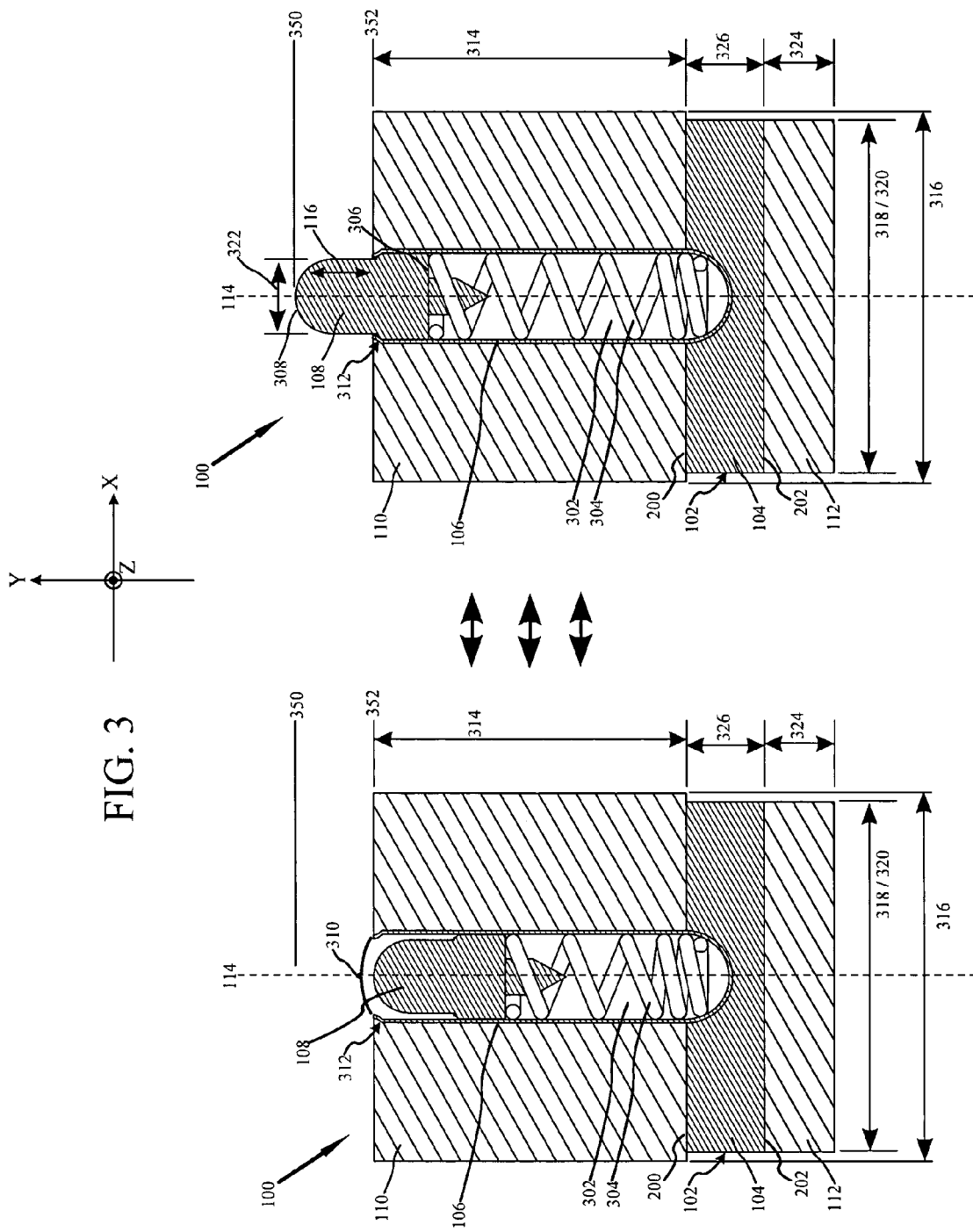
FIG. 3 is a cut through side view of the spring loaded microwave interconnector shown in FIG. 1.

FIG. 3 a cut through of SLMI 100 as indicated in FIG. 1, first with conductive tip 108 compressed as on the left, and second with conductive tip 108 extended as on the right. In at least one embodiment, the central conductor 106 includes a conductive sleeve 300 defining an internal chamber 302 about the central axis 114. In at least one embodiment the conductive sleeve 300 and probe head 104 are machined as a single unitary structure. In at least one alternative embodiment, the conductive sleeve 300 and probe head 104 are fabricated independently and coupled together.

A spring 304 is disposed within the chamber 302. The conductive tip 108 has a base 306 and a distal tip 308. The conductive tip 108 is structured and arranged to fit within the chamber 302 such that the base 306 is in contact with the spring 304 and the distal tip 308 extends through an aperture 310 at the end of the conductive sleeve 300. A retainer 312 is structured and arranged to retain the conductive tip within the sleeve, the retainer 312 permitting actuation of the conductive tip along the central axis so as to compress the spring 304 and move the conductive tip to a compressed position 352.

In at least one embodiment the retainer 312 is a crimp. Specifically the crimp defines the aperture 310 to have a dimension (i.e. diameter) that is less than the internal diameter of the conductive sleeve 300. The crimping of the sleeve is designed such that there is constant DC between the conductive sleeve 300 and the conductive tip 108. The outside diameter of the conductive tip 108 and the inside diameter of the conductive sleeve 300 may also be selected to provide constant contact during actuation. This constant state of contact permits the SLMI 100 to operate at microwave frequency. As shown clearly in FIG. 3, in at least one embodiment the distal end of the conductive tip 108 is rounded to allow connection at different angles.

As is further appreciated with respect to FIG. 3, the first dielectric 110 extends from the first side 200 of the probe head 104 along a first dimension (Y-axis as shown) to the compressed position 352 of the conductive tip 108. In at least one embodiment this corresponds to the height 314 of the first dielectric 110. In at least one embodiment this height 314 is about the same as the end of the conductive sleeve 300. Moreover, as shown the extended position 350 of the conductive tip 108 is such that the tip extends beyond the dielectric sleeve 110, whereas the compressed position 352 is such that the tip is about flush with the dielectric sleeve 110. In at least one embodiment, in the extended position 350 the tip 108 extends beyond the dielectric sleeve 110 by approximately 0.02 inch.

The first dielectric 110 also defines a second dimension 316 that, as shown, is transverse to the Y-axis. With respect to embodiments wherein the first dielectric is a dielectric sleeve 110, the second dimension 316 is understood and appreciated to be the outside diameter of the dielectric sleeve 110. The second dielectric 112 and the probe head 104 each have a dimension 318, 320 that is parallel to and equal to or less than the second dimension 316. In at least one embodiment this dimension 318, 320 corresponds to a diameter.

Moreover, with respect to FIG. 3, in at least one embodiment, the dielectric disc, e.g. the second dielectric 112, has a first diameter 318. The probe head 104 has a second diameter 320 about equal to the first diameter 318. In at least one embodiment, the outside diameter 316 of the dielectric sleeve 110 is greater than the first diameter 318. Having the first and second diameters 318, 320 slightly smaller than the outside diameter 316 of the dielectric sleeve 110 is preferable in at least one embodiment to facilitate ease of installation and self alignment of the SLMI 100 within a waveguide, as is shown in FIGS. 4~10.

In at least one embodiment, the first diameter 318 and the second diameter 320 are approximately between 0.126 and 0.131 inch. The outside diameter 316 is approximately between 0.128 and 0.132 inch. The conductive tip 108 has a diameter 322 of approximately 0.024 inch. Further, the second dielectric 112 has a height 324 of approximately 0.04 inch and the probe head 104 has a height 326 of approximately 0.04 inch. The height 314 of the dielectric sleeve 110 is approximately 0.123 inch.

In at least one embodiment, the probe head 104, spring loaded central conductor 106 and conductive tip 108 are formed of conductive materials selected from the group consisting of brass, copper, silver, gold, aluminum and combinations thereof. In at least one specific embodiment, the probe head 104, and spring loaded central conductor 106 are formed of Nickel Silver with gold plating, the conductive tip 108 is formed of BeCu with gold plating, and the spring 304 is music wire with gold plating.

The first dielectric 110 and second dielectric 112 are understood and appreciated to be non-conductive materials. The type of non-conductive materials utilized as the first dielectric 110 and the second dielectric 112 are determined by the transmission characteristics desired for the SLMI 100, such as, for example, where the SLMI 100 is operable as a 50 ohm transmission line. The first dielectric 110 and the second dielectric 112 may be composed of the same material or they may each be composed of a different material. In at least one embodiment the first dielectric 110 is TXP material as manufactured by Mitsui Plastics, Inc., and the second dielectric 112 is GE or Rogers board material.

For the dimension specifications as set forth above and to establish a 50 ohm transmission line, in at least one embodiment the dielectric sleeve, i.e. the first dielectric 110, is selected to have a dielectric constant of 2.6 and the dielectric disc, i.e. the second dielectric 112, is selected to have a dielectric constant of 4.0. The height 314 of the dielectric disc 112 is designed to optimize the capacitive coupling of the RF signal from the probe head 104 to the waveguide.

The spring loaded conductor 102, first dielectric 110 and second dielectric 112 cooperatively interact to provide a matched impedance path between a PCB and a waveguide. Stated simply, this is understood to imply that no signal is lost in transmission from a waveguide to a PCB and vice versa when the SLMI 100 is used as the interconnector. Establishing a matched impedance path is highly desirable, for in signal processing it is generally of paramount importance to deliver signals between areas of the processing environment with as little alteration, transformation or degradation as possible.

Moreover, to process the signal it is generally of significant importance to know when and how the signal is modified or altered, and to avoid the opportunity for unintended and unaccounted for modification or degradation. In layman's terms, a matched impedance path is therefore understood and appreciated to suggest that a signal provided through a waveguide will be received by SLMI 100 and delivered to a PCB through the conductive tip 108 without significant change, and vice versa.

Figure 4:
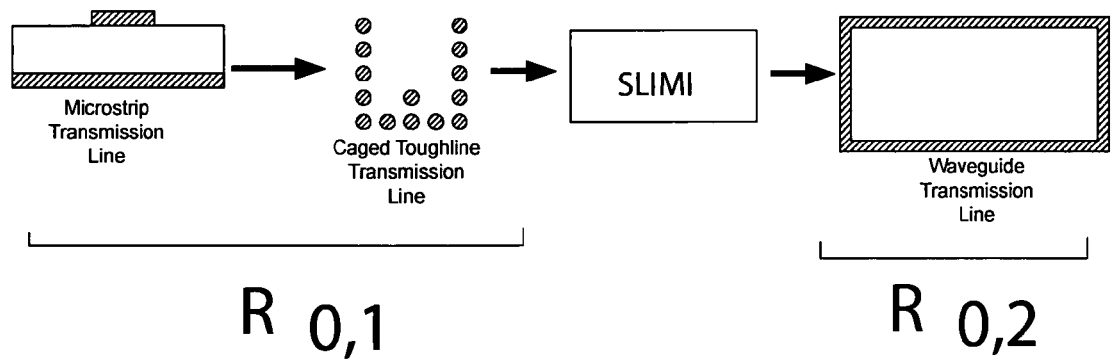
FIGS. 4, 5A, and 5B illustrate the issues of matched impedance.
Figure 5A:
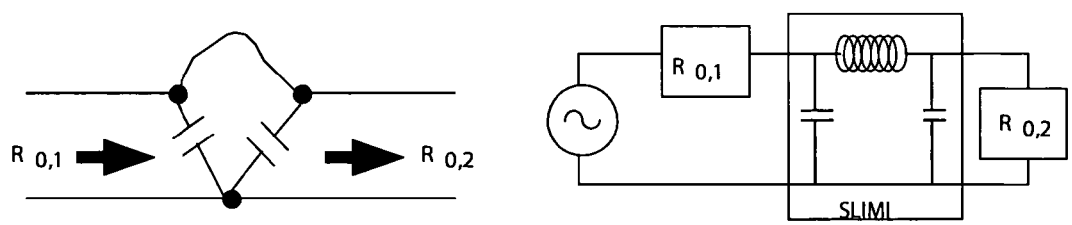
Figure 5B:
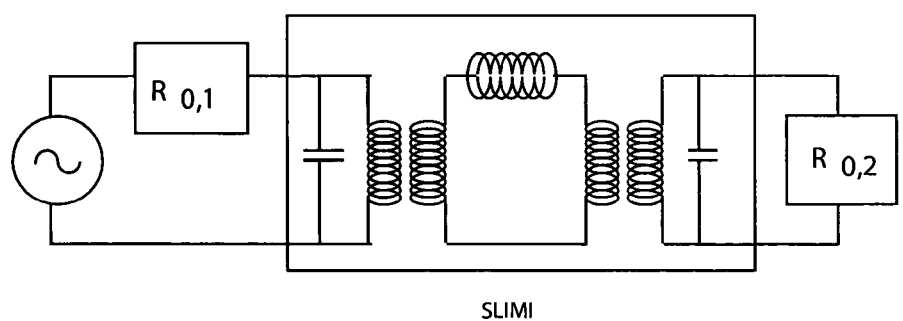

FIGS. 4, 5A, and 5B present illustrations to further assist in a high level overview of matched impedance. More specifically, a simple way to convey the importance of impedance matching in transmission lines such as a waveguide and the microstrip of a PCB, is to consider the power transfer at the junction of two contiguous semi-infinite lengths of uniform lossless transmission line, as shown in FIG. 4. The quality of uniform lossless transmission lines that is of interest is that of characteristic impedance, a property derived from the line's cross-sectional geometry and of the type and distribution of dielectric material used in the line's physical construction.

Characteristic impedance is denoted herein as $R_0$. It is commonly understood that lossless transmission lines possess a characteristic impedance that is purely real, i.e., containing no reactive component. Allowing the two transmission lines to have arbitrary independent characteristic impedances, these impedances are denoted as $R_{0,1}$ and $R_{0,2}$. It can be shown that the energy into $R_{0,2}$ is maximized for fixed values of $R_{0,1}$ and $V_s$ when the two resistors ($R_{0,1}$ and $R_{0,2}$) are of equal value. That is, maximum available power:

$$P_{max} = |V_s|^2 / 4R_{0,1}$$

is transferred to $R_{0,2}$ when $R_{0,1}$ and $R_{0,2}$ are matched in value. Therein lies the importance of matching impedances, also known as impedance matching, in high frequency circuits. Note that this condition of maximum power transfer occurs when the impedance $Z_{in}$ into the junction seen by the incident energy is equal to, or matched with, the characteristic impedance of the transmission line carrying the incident energy to the junction.

With reference to FIG. 4, $R_{0,1}$ would be the strip transmission line circuitry (e.g. a microstrip) within the PCB operating in the TEM mode while $R_{0,2}$ would be the waveguide operating at several different mode configurations (TEM and $TE_{01}$ for example). Within the PCB, the microstrip line is converted to cage troughline transmission line, using a combination of signal and ground vias, to reroute the RF signal through the PCB and make contact with the SLIMI 100.

Figure 6:
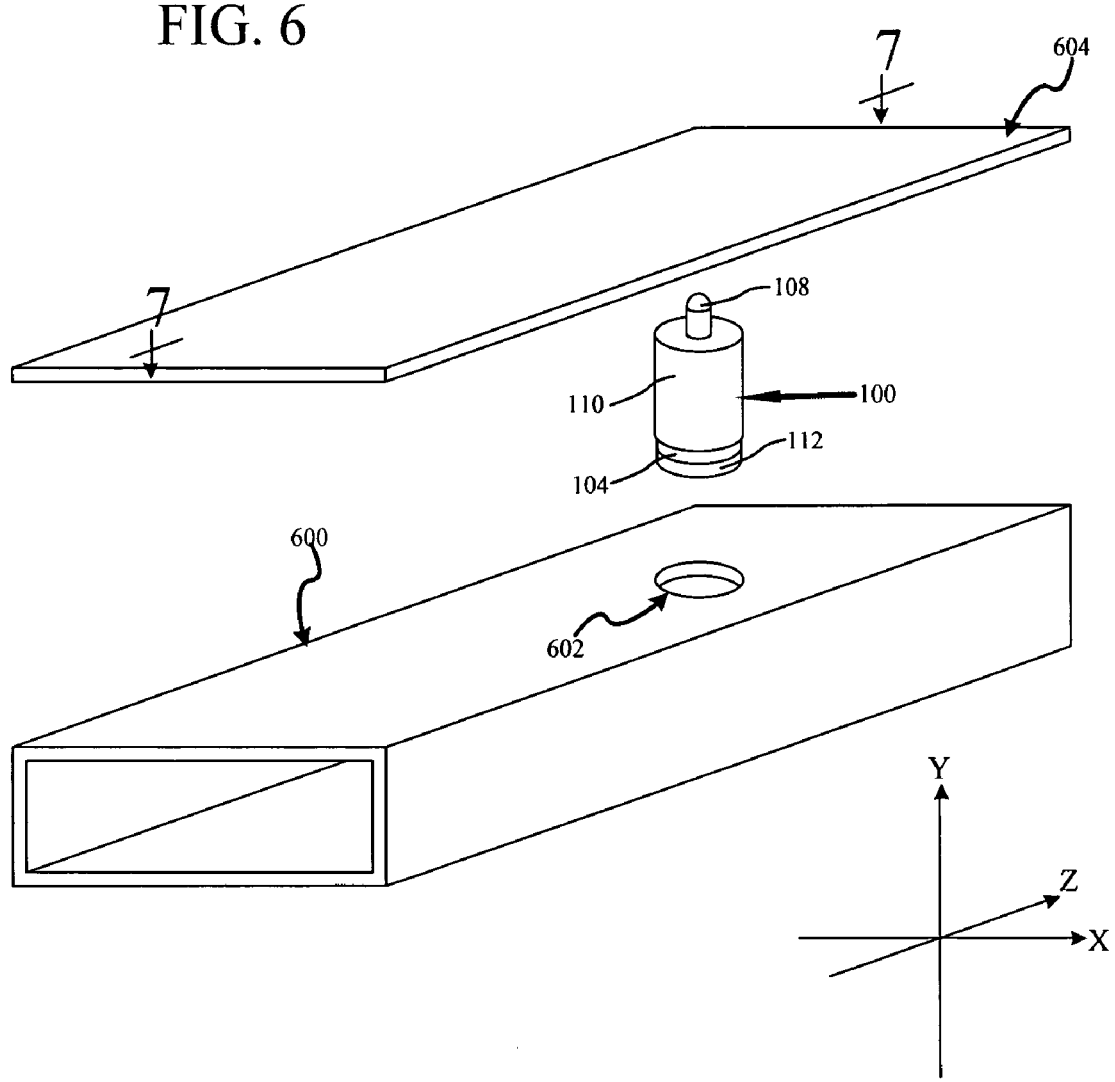
FIG. 6 is an exploded perspective view of the spring loaded microwave interconnector, waveguide and PCB assembly in accordance with at least one embodiment.

The SLIMI 100 is analogous to the series inductive elements as show in FIG. 5A, which is the basic element in a low pass filter. In at least one embodiment, the next order of sophistication would be to include shunt capacitors at the ends the inductor which would represent contact signal and ground points between the SLIMI 100 and PCB and also the controlled gap between the SLIMI 100 probe head 104 and the waveguide wall 804 respectively (see FIG. 8). Adjusting the 3-D physical dimensions of the contact points, SLIMI 100 and gap permits variation and selection of the inductor and capacitor values needed to effect a matched impedance transition between the microstrip and waveguide. Since the RF field propagation in the PCB and waveguide are different, a pair of ideal transformer are included in the circuit model as shown in FIG. 5B FIGS. 6 through 8 illustrate a waveguide to PCB interconnector assembly utilizing a SLIMI 100 as a solderless interconnector in accordance with at least one embodiment. More specifically, FIG. 6 illustrates a simplified perspective view of a waveguide 600, a PCB 604 and a SLIMI 100 as described above. As shown in FIG. 4 the waveguide 600 provides an aperture 602 that is appropriately sized to receive the SLIMI 100.

Figure 7:
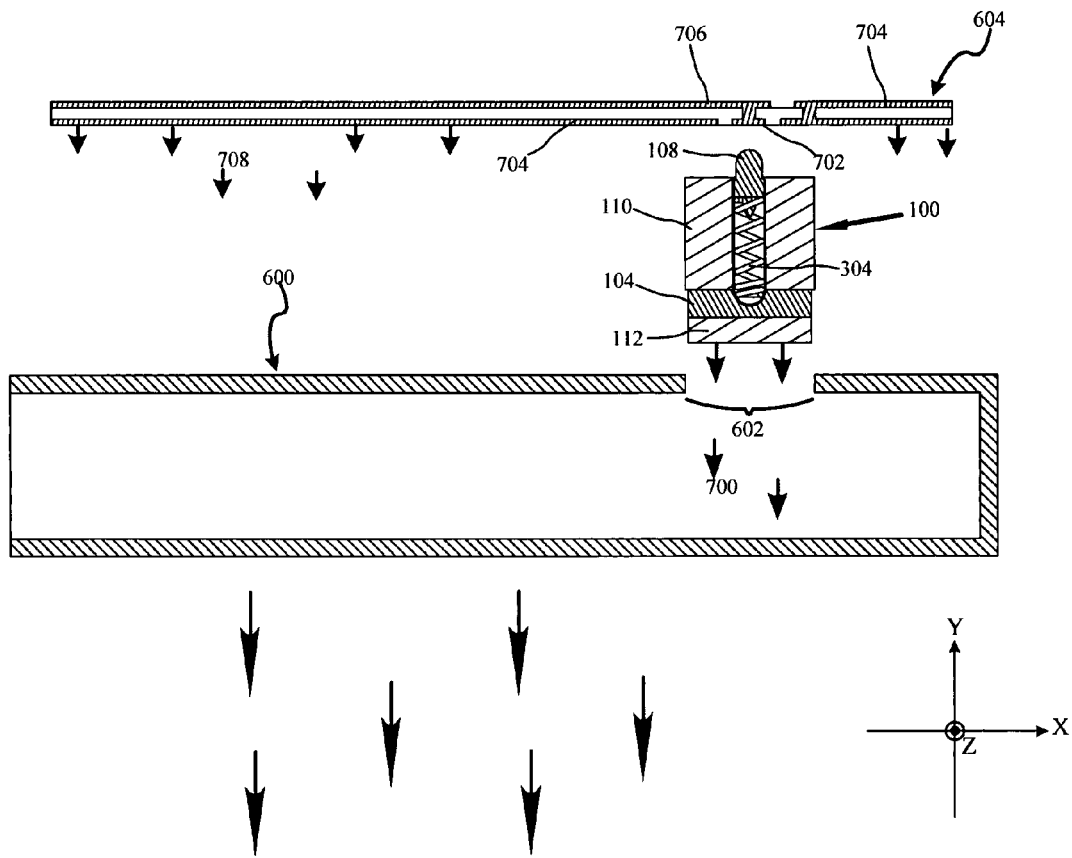
FIG. 7 is a side view of the assembly shown in FIG. 6.
Figure 8:
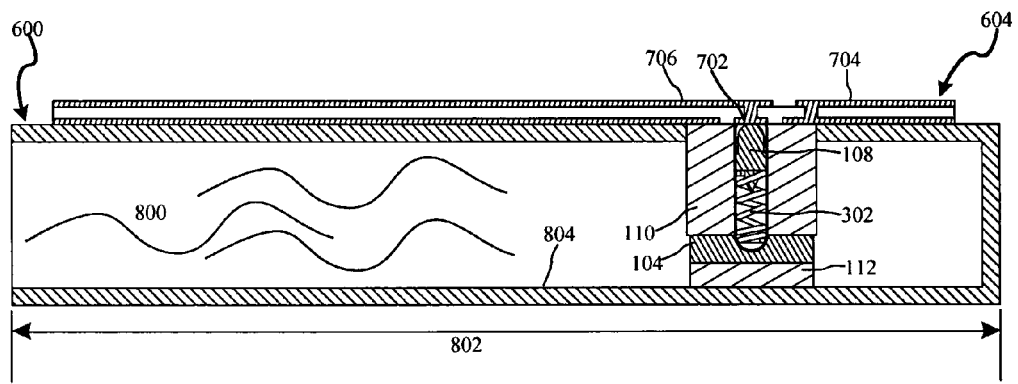
FIG. 8 is a side view of assembly shown in FIG. 7 with the components disposed together.
Figure 9:
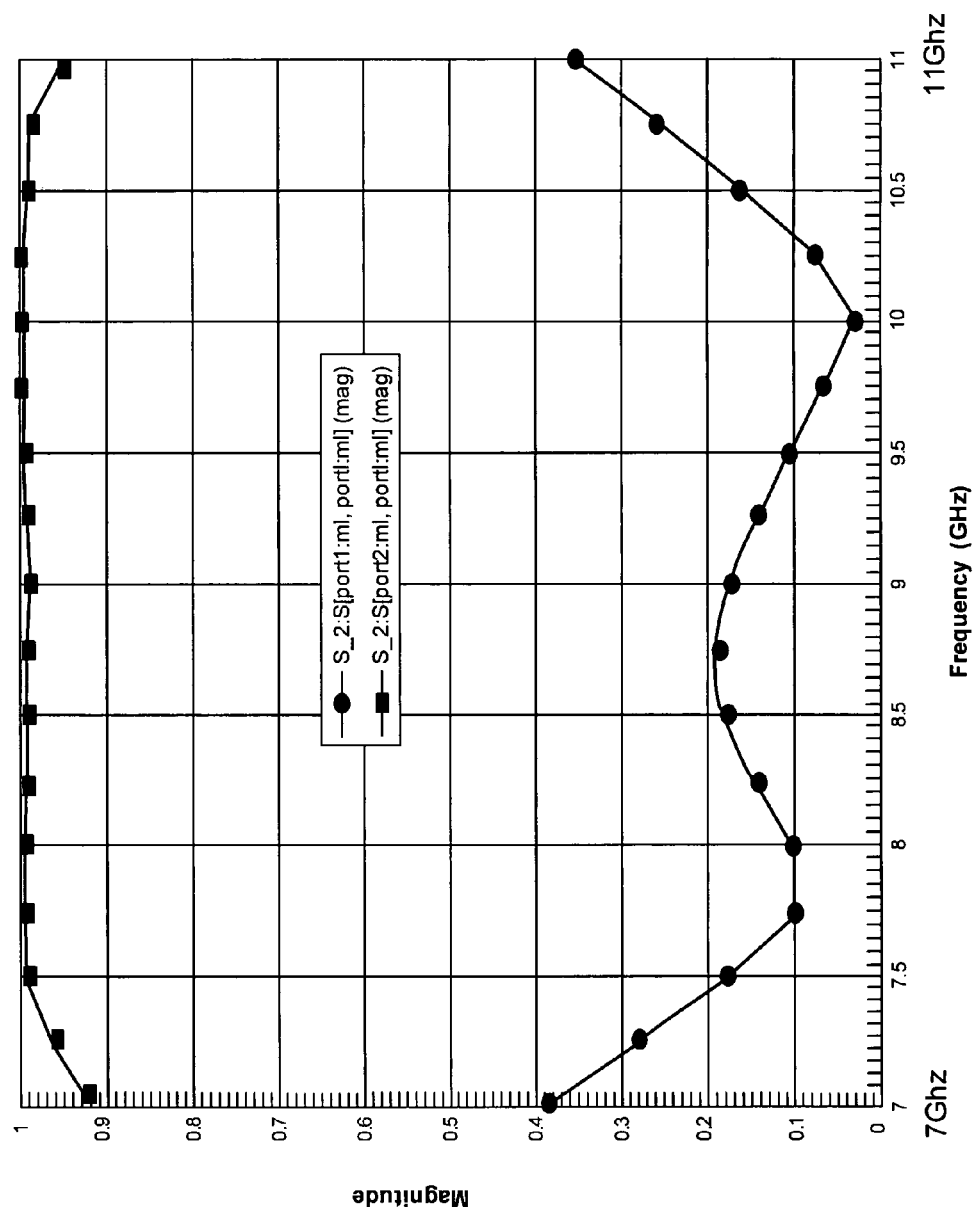
FIG. 9 is a graph representing performance data for the spring loaded microwave interconnector in accordance with at least one embodiment.

With respect to FIGS. 6~8, aperture 602 is show to exist in a sidewall of the waveguide 600. It is understood and appreciated that waveguides of different geometric cross sections can and do exist, and the depiction of waveguide 600 as being generally rectangular is as a matter of convenience for ease of illustration and discussion, and not a limitation. Further, in at least one alternative embodiment, the aperture can be located in the end wall of the waveguide as opposed to the sidewall as shown.

FIG. 7 is a side cut through view of the waveguide 600, PCB 604 and SLIMI 100 as indicated in FIG. 6. As indicated by arrows 700, the SLIMI 100 is deposited into aperture 602. In at least one embodiment this fitting is advantageously achieved by simply slipping the SLIMI 100 into the aperture by hand.

As shown in the FIG. 5 and described above with respect to FIG. 3, the diameter of the dielectric disc 112 and waveguide probe head 104 is slightly less than the outside diameter of the dielectric sleeve 110. This slightly smaller diameter pairing has been found advantageous in some settings to help facilitate the installer in placing the SLIMI 100 into the aperture and down into the waveguide 600. Moreover, SLIMI 100 is advantageously installed without special tools and is retained without bonding or mechanical fastening.

With respect to FIG. 7, the PCB 604 is shown to provide at least one ground plane or ground line 704, a contact pad 702 and signal trace 706 coupled to the contact pad 702. The contact pad is intended to achieve contact with the conductive tip 108 of the SLIMI 100. As is further shown in FIG. 5, the spring 304 is extended such that the conductive tip 108 is fully extended.

After SLIMI 100 has been deposited in the aperture 602 as indicated by arrows 700, the PCB 604 is brought into contact with the waveguide 600 as indicated by arrows 708 such that the assembly is as shown in FIG. 8. As shown, the contact pad 702 is aligned to and in contact with the conductive tip 108. As the PCB 604 is in contact with the waveguide 600, the conductive tip 108 is now in a compressed position.

As shown in FIG. 8, with the PCB 604 disposed upon the waveguide 600, the ground line 704 is in direct contact with the waveguide 600 while the conductive tip 108 is in direct contact with the contact pad 702. It is appreciated that there is an annular clearout region around the contact pad 702 to prevent short circuiting the microstrip line to the ground line 704.

With respect to FIG. 8, it is appreciated that SLIMI 100 is seated against the bottom of the waveguide 600. More specifically, the dielectric disc 112 serves as a spacer to separate the probe head 104 from the bottom of the waveguide 600, which is also understood and appreciated to be a ground plane. The diameter of the probe head 104 dictates the diameter of the dielectric disc 112. The distance of the probe head 104 from the ground plane then determines the dielectric constant for the dielectric disc.

Moreover, the dielectric disc 112 provides control for the distance the probe head 104 is from the inner wall 804 of the waveguide 600. By varying this width of the dielectric disc 112 and the material comprising the dielectric disc, it is possible to control the level of capacitance (i.e., the amount of RF energy coupling) between the probe head 104 and the waveguide wall. Moreover, the dielectric disc 112, which in certain embodiments may be termed a dielectric cap, serves at least two advantageous functions for the SLIMI 100. First, it ensures that the conductive portion of the SLIMI 100 (e.g. the probe head 104) is maintained at a predetermined distance from the ground plane of the waveguide 600. (e.g. the inner wall 804) Second, it provides a known dielectric constant between the probe head 104 and the ground plane of the waveguide 600.

As shown in FIG. 8, the SLIMI 100 is self aligning within the waveguide as the dielectric disc 112 rests against the waveguide wall to provide horizontal alignment and the dielectric sleeve 110 rests against the aperture wall to provide vertical alignment. As may be appreciated from FIG. 8, the dielectric sleeve 110 and conductive sleeve 300 are flushed to the outside wall of the waveguide 600. As is shown clearly in FIGS. 10 and 12, only the actuating conductive tip 108 extends beyond the outside wall of the waveguide 1000, 1200.

Friction between the dielectric sleeve 110 and the metal wall of the aperture opening of the waveguide 600 serves to hold the SLIMI 100 in place within the waveguide 600 when the PCB 604 is removed or otherwise not present in contact.

In addition to being a solderless interconnector, SLIMI 100 is in at least one embodiment, a compression based interconnector. More specifically, the spring 304 of the central spring loaded conductor 102 insures that the conductive tip 108 is in electrical contact with the contact pad 702 when the PCB 604 is disposed adjacent to the waveguide 600 in a proximity that is equal to or less than the actuation distance of the conductive tip 108 between its extended position and its compressed position. In other words, vibration, slight surface irregularities, and/or other factors that might frustrate direct contact between the waveguide 600 and the PCB 604 may be advantageously overcome by the SLIMI 100 as it serves to interconnect the waveguide 600 and PCB 604 for signal propagation.

In other words, in at least one embodiment the SLIMI 100 is a signal redirection antenna within the waveguide 600, e.g. receiving the signals 800 traveling generally in a direction along the length 802 of the waveguide and redirecting the received signals 800 to the PCB 604. The SLIMI 100 is also operable in reverse, i.e. receiving the signals from the PCB 604 and acting as an antenna to redirect them into the waveguide 600.

For example, an RF signal may be initially launched from the microstrip line of the PCB 604 that transition from the contact pad 702 to the SLIMI 100, and more specifically the probe head 104. A voltage potential is generated between the probe head 104 and the inner wall 804 of the waveguide 600, thus causing the RF signal to capacitively couple into the waveguide 600 from the spring loaded conductor 102. Moreover, the spring loaded coax central conductor 106 permits the RF signal to enter the waveguide region and holds the SLMI 100 in place in a first dimension. SLMI 100 is held in place in the second dimension, transverse to the first dimension by the dielectric 110. An electromagnetic model has been generated and is provided as FIG. 9 to show the SLMI 100 operation over a wide frequency band from 7 Ghz to 11 Ghz with good RF performance.

FIGS. 10-11 and 12-13 illustrate embodiments of a multiport waveguide to multiport PCB assemblies utilizing a plurality of SLMIs 100 as discussed and described above. Specifically, in FIGS. 10 and 11 a multiport waveguide 1000 is shown having a plurality of waveguide ports 1002, of which waveguide ports 1002A~1002E are exemplary. Each waveguide port 1002 provides an aperture 602 as described with respect to FIGS. 5~6 into which a corresponding SLMI 100A~100E is deposited as indicated by arrows 700.

A multiport PCB 1004 is also shown having a plurality of contact pads 702, of which contact pads 702A~702E are exemplary. As shown, the contact pads are aligned to SLMIs 100A~100E. Multiport waveguide 1000 is shown to have a first contour 1006, which is further conceptually illustrated by a straight line. Moreover, first contour 1006 is flat. Multiport PCB 1004 is shown to have a second contour 1008, which is further conceptually illustrated by a straight line. Moreover, second contour 1008 is flat.

As multiport PCB 1004 is brought into contact with the multiport waveguide assembly 1000, indicated by arrows 1010, the conductive tips 108 of each SLMI 100 are compressed. The resulting assembly is as shown in FIG. 11.

Figure 10:
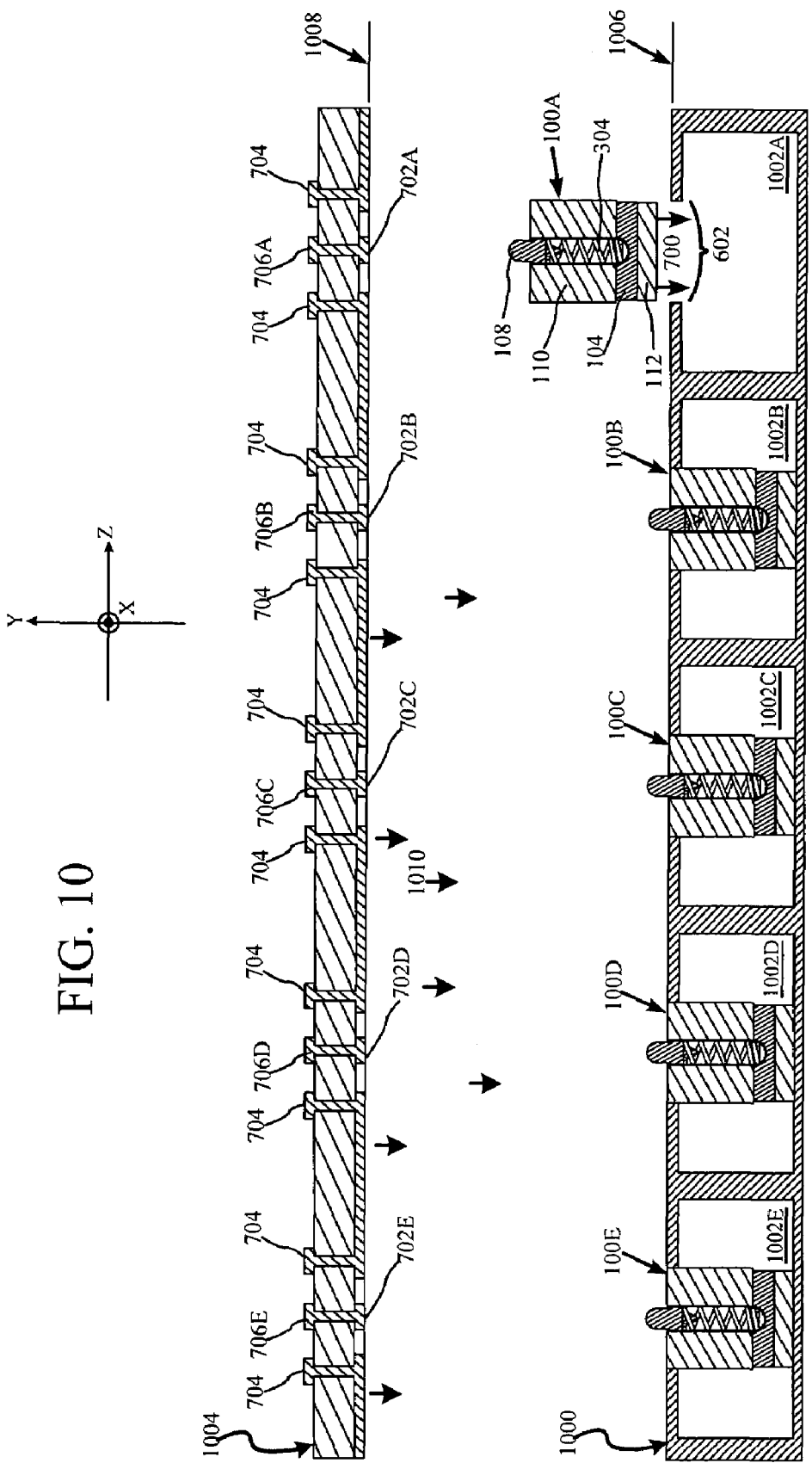
FIGS. 10 and 11 and are side views of a waveguide to PCB interconnector assembly incorporating the spring loaded microwave interconnector, the waveguide and PCB having a flat contour according to one embodiment.
Figure 11:
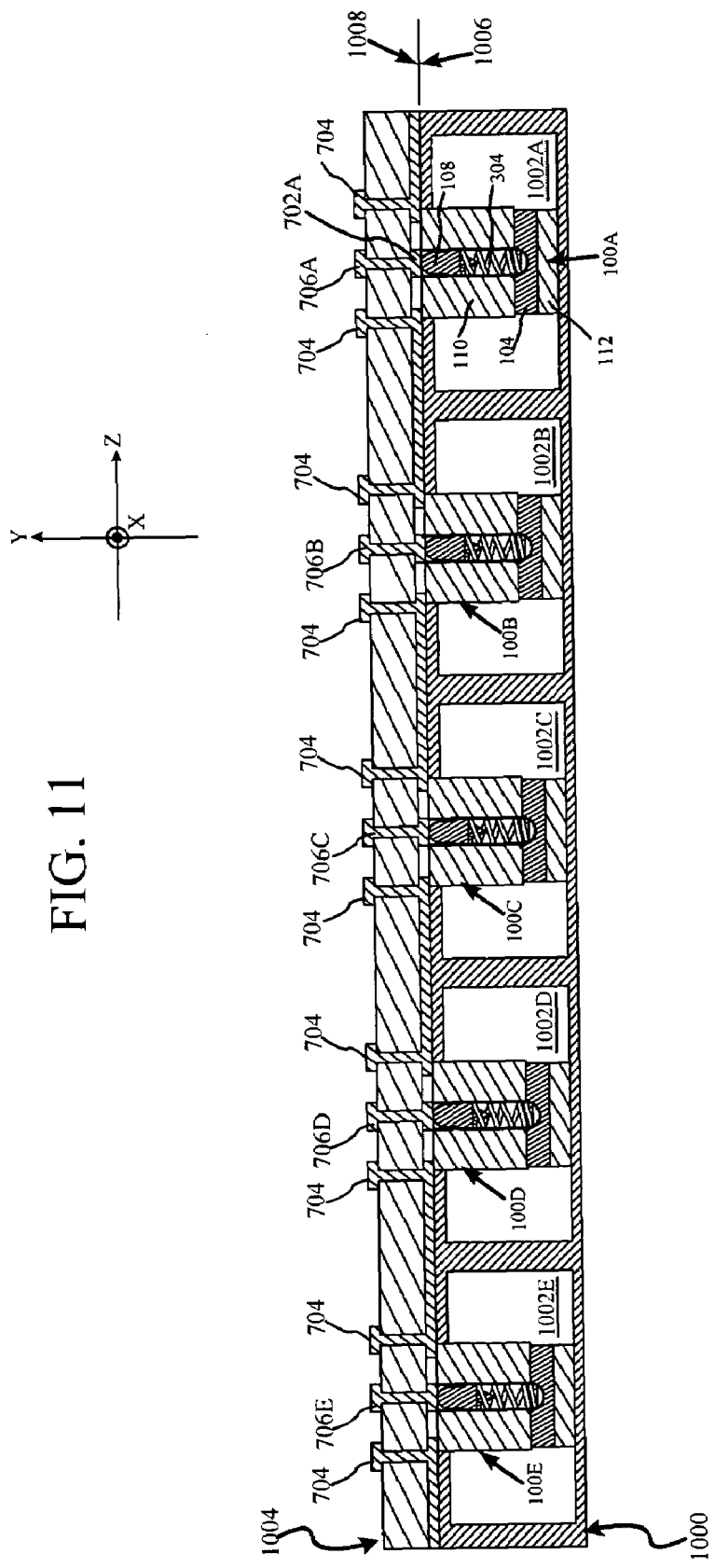

Whereas FIGS. 10 and 11 illustrate an embodiment where the multiport waveguide 1000 and multiport PCB 1004 are flat in contour, at least in the proximate area of the interconnections, situations may arise where curved contours are advantageous, but still require proper interconnection. As FIGS. 12 and 13 illustrate, in at least one embodiment, the SLMI 100 as described above advantageously permits a curved multiport waveguide 1200 to a curved multiport PCB 1004 assembly to be provided.

Figure 12:
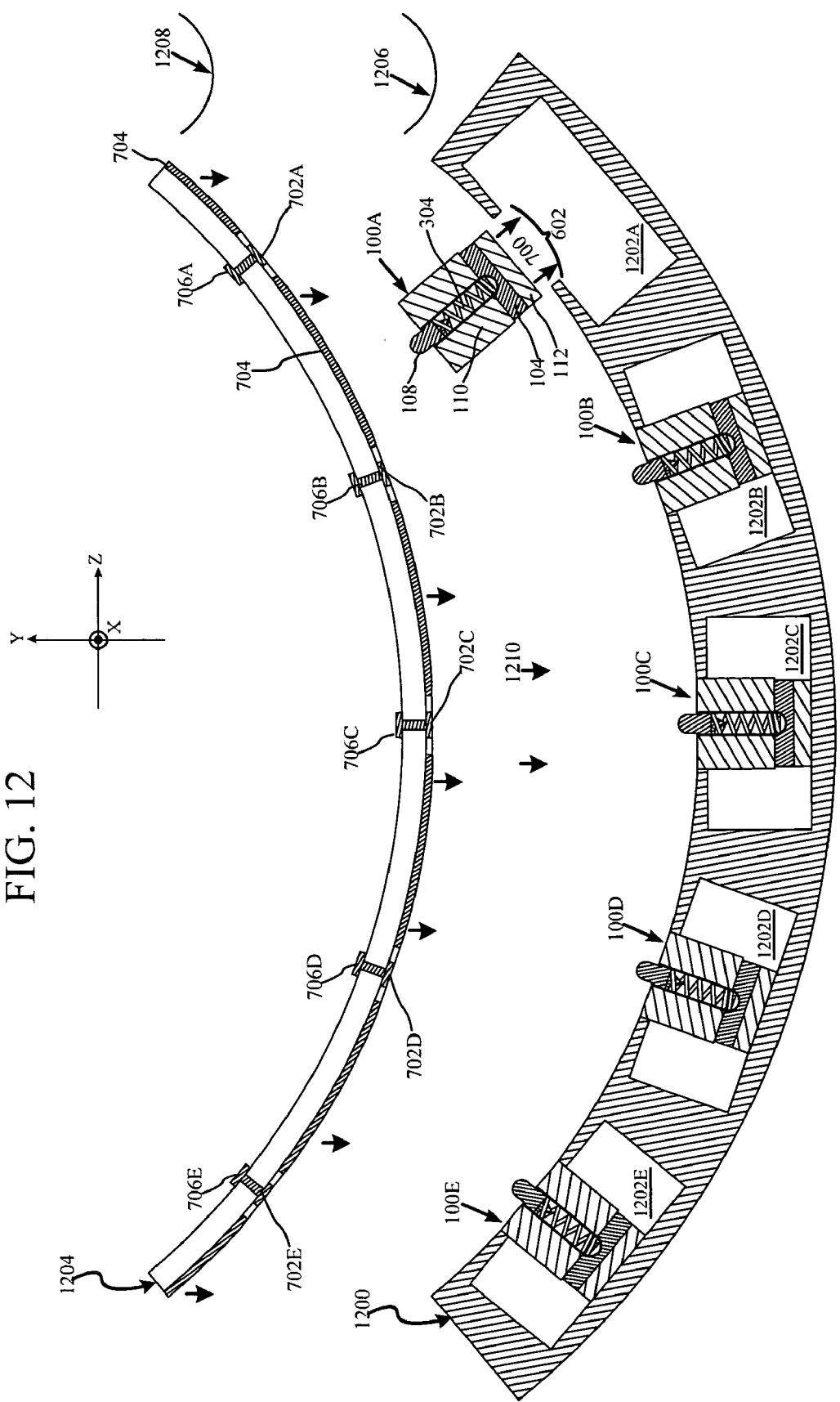
FIGS. 12 and 13 and are side views of a waveguide to PCB interconnector assembly incorporating the spring loaded microwave interconnector, the waveguide and PCB having a curved contour according to one embodiment.
Figure 13:
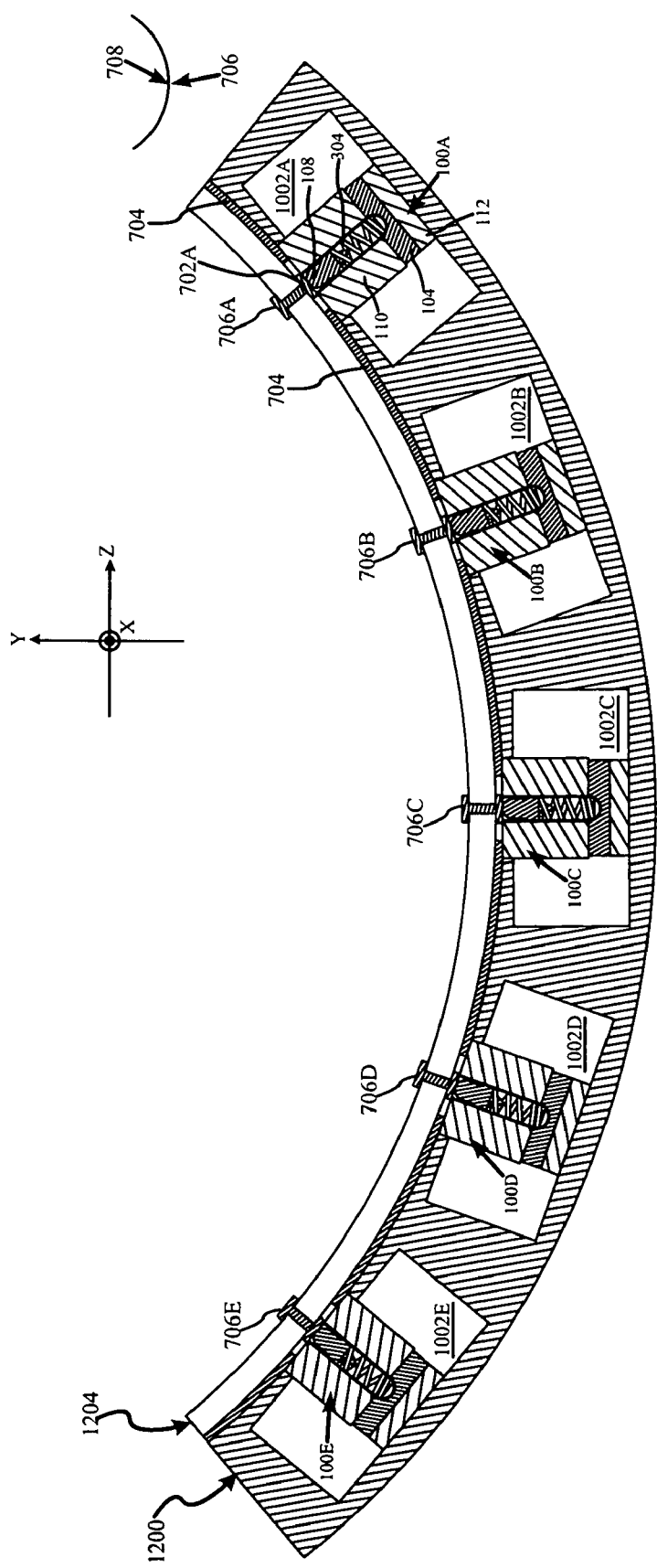

Specifically, in FIGS. 12 and 13 a multiport waveguide 1200 is shown having a plurality of waveguide ports 1202, of which waveguide ports 1202A~1202E are exemplary. Each waveguide port 1202 provides an aperture 602 as described with respect to FIGS. 6~8 into which a corresponding SLMI 100A~100E is deposited as indicated by arrows 700.

A multiport PCB 1204 is also shown having a plurality of contact pads 702, of which contact pads 702A~702E are exemplary. Whereas, ground trances 704 are shown in FIGS. 7 and 8, they have been omitted in FIGS. 11 and 12 for illustration simplicity.

As shown, the contact pads 702 are aligned to SLMIs 100A~100E. Multiport waveguide 1200 is shown to have a first contour 1206, which is further conceptually illustrated by a curved line. Moreover, first contour 1206 is curved. Multiport PCB 1204 is shown to have a second contour 1208, which is further conceptually illustrated by a curved line. Moreover, second contour 1008 is curved.

As multiport PCB 1204 is brought into contact with the multiport waveguide assembly 1200, indicated by arrows 1210, the conductive tips 108 of each SLMI 100 are compressed. The resulting assembly is as shown in FIG. 13. Although first contour 1206 may be described as being concave, and second contour 1208 may be described as being convex, this relationship has been adopted for the ease of illustration. It will be understood and appreciated that the first contour 1206 may be convex and the second contour 1208 concave, and further that the contour each may vary, i.e. having elements of both concave and convex curvature.

Specifically, it is understood and appreciated that for points of interconnection, the contour (flat, curved or combinations thereof) of the multiport PCB 1204 will match to the contour (flat, curved or combinations thereof) of the multiport waveguide 1200.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A spring loaded microwave interconnector (SLMI), comprising:
    a spring loaded conductor having a base and an actuating tip, the actuating tip having an extended position and a compressed position;
    a disc conductor coupled to the base of the spring loaded conductor;
    a first dielectric disposed about the spring loaded conductor, the first dielectric extending in a first direction from the base to the actuating tip and having an outer dimension in a direction transverse to the first direction;
    a second dielectric disposed adjacent the disc conductor and opposite from the first dielectric, the second dielectric and the disc conductor each having a substantially equal outer dimension, in a direction parallel to the direction of the outer dimension of the first dielectric, that is less than or equal to the outer dimension of the first dielectric.

2. The spring loaded microwave interconnector of claim 1, wherein the spring loaded conductor, disc conductor, first dielectric and second dielectric cooperatively interact to provide a matched impedance line between a PCB and a waveguide.

3. The spring loaded microwave interconnector of claim 1, wherein the spring loaded microwave interconnector is configured to self-align in a waveguide.

4. The spring loaded microwave interconnector of claim 1, wherein the first dielectric is a cylindrical sleeve and the second dielectric is a disc.

5. The spring loaded microwave interconnector of claim 1, wherein the spring loaded conductor includes:
    a conductive sleeve defining an internal chamber about a central axis and an aperture concentric about the central axis,
    a spring disposed within the chamber;
    the actuating tip having a base and a distal tip disposed within the chamber between the aperture and the spring, the base adjacent to the spring and the distal tip extending through the aperture;
    a retainer structured and arranged to retain the actuating tip within the conductive sleeve.

6. The spring loaded microwave interconnector of claim 5, wherein the retainer is a crimp in the conductive sleeve defining the aperture to have a diameter less than a diameter of the chamber.

7. The spring loaded microwave interconnector of claim 1, wherein the spring loaded microwave interconnector is operable as a solderless interconnector between a waveguide and a PCB assembly.

8. The spring loaded microwave interconnector of claim 1, wherein the spring loaded microwave interconnector is operable as a compression based interconnector between a waveguide and a PCB assembly.

9. A spring loaded microwave interconnector assembly (SLMI), comprising:
a dielectric sleeve circumferentially about a spring loaded coax central conductor, the coax central conductor providing an actuating tip at a first end and a probe head at a second end, a dielectric cap coupled to the probe head opposite from the tip, the coax central conductor, probe head, dielectric sleeve and dielectric cap cooperatively interacting to provide a matched impedance transmission line between a PCB assembly and a waveguide;
wherein the spring loaded microwave interconnector is operable as a solderless interconnector within the waveguide coupled to and the PCB assembly.

10. The spring loaded microwave interconnector of claim 9, wherein the spring loaded microwave interconnector is a self aligning interconnector between the waveguide and the PCB assembly.

11. The spring loaded microwave interconnector of claim 9, wherein the spring loaded microwave interconnector is operable as a compression based interconnector between the waveguide and the PCB assembly.

12. A spring loaded microwave interconnector (SLMI), comprising:
a waveguide probe head having a first side and opposite thereto a second side, the sides transverse to a central axis;
a spring loaded coax central conductor coupled to the probe head first side and providing an actuating tip, the coax central conductor extending along the central axis;
a dielectric sleeve disposed about the coax central conductor and adjacent to the first side, the distal conductive tip extending beyond the dielectric sleeve; and
a dielectric disc coupled to the second side of the waveguide probe head,
wherein the spring loaded microwave interconnector is configured to establish a signal redirection antenna within a waveguide.

13. The spring loaded microwave interconnector of claim 12, wherein the dielectric disc has a first diameter, the probe head having a second diameter about equal to the first diameter, the dielectric sleeve having an outside diameter greater than the first diameter, and the coax central conductor having a third diameter less than half of the first diameter.

14. The spring loaded microwave interconnector of claim 13, wherein the first diameter and the second diameter are approximately between 0.126 and 0.131 inch, the outside diameter is approximately between 0.128 and 0.132 inch, the conductive tip having a diameter approximately 0.024 inch, the probe head and dielectric disc each having a height of approximately 0.04 inch, the dielectric sleeve having a height of approximately 0.123 inch, the conductive tip extending beyond the dielectric sleeve by approximately 0.02 inch.

15. The spring loaded microwave interconnector of claim 12, wherein the spring loaded microwave interconnector is operable as a 50 ohm transmission line.

16. The spring loaded microwave interconnector of claim 12, wherein the probe head, coax central conductor, dielectric sleeve and dielectric disc cooperatively interact to provide a matched impedance path.

17. The spring loaded microwave interconnector of claim 12, wherein the spring loaded microwave interconnector is structured and arranged to press-fit between the waveguide having an aperture structured and arranged to receive the SLMI and a microwave PCB assembly having a contact pad aligned to the aperture, the SLMI providing signal transmission between the waveguide and the PCB assembly.

18. The spring loaded microwave interconnector of claim 17, wherein the SLMI provides solderless interconnection between the waveguide and the PCB assembly.

19. The spring loaded microwave interconnector of claim 17, wherein the SLMI provides compression based interconnection between the waveguide and the PCB assembly.

20. The spring loaded microwave interconnector of claim 12, wherein the spring loaded microwave interconnector is configured to self-align in the waveguide.

21. The spring loaded microwave interconnector of claim 12, wherein the spring loaded coax central conductor includes:
a conductive sleeve defining an internal chamber about the central axis and an aperture concentric about the central axis, a spring disposed within the chamber;
the actuating tip having a base and a distal tip disposed within the chamber between the aperture and the spring, the base adjacent to the spring and the distal tip extending through the aperture;
a retainer structured and arranged to retain the actuating tip within the conductive sleeve.

22. The spring loaded microwave interconnector of claim 21, wherein the retainer is a crimp in the conductive sleeve defining the aperture to have a diameter less than a diameter of the chamber.

23. A waveguide to PCB interconnector assembly, comprising:
a microwave waveguide having a first curving contour and an aperture provided in the first curving contour;
a microwave PCB having a second contour, the PCB adjacent to the waveguide and the second contour matching to at least a part of the first curving contour, the PCB providing a contact pad adjacent to the aperture;
a spring loaded microwave interconnector (SLMI) disposed in the aperture, the SLMI providing a self aligned probe head within the waveguide, the probe head electrically coupled to a spring loaded coax central conductor having an actuating conductive tip in electrical contact with the contact pad.

24. The waveguide to PCB interconnector assembly of claim 23, wherein for the SLMI:
the waveguide probe head has a first side and a second side transverse to a central axis, the spring loaded central conductor coupled to the probe head first side and extending along the central axis, the actuating conductive tip at least partly disposed in the central conductor opposite from the base, the actuating conductive tip having an extended position and a compressed position;
a dielectric sleeve disposed about the coax central conductor and adjacent to the first side, the extended position of the actuating conductive tip extending beyond the dielectric sleeve; and
a dielectric disc coupled to the second side of the waveguide probe head.

25. A waveguide to PCB interconnector assembly, comprising:
a multiport waveguide assembly having a first contour, each port providing an aperture in the first contour;
a multiport microwave PCB assembly having a second contour, the PCB assembly adjacent to the waveguide assembly and matching at least a part of the first contour, each port of the waveguide paired to a port of the PCB assembly;

a spring loaded microwave interconnector (SLMI) disposed in each port aperture and interconnecting a paired waveguide port and PCB port, each spring loaded microwave interconnector including:

a waveguide probe head having a first side and opposite thereto a second side, the sides transverse to a central axis;

a spring loaded coax central conductor extending from the first side of the probe head and providing an actuating conductive tip, the coax central conductor extending along the central axis;

a dielectric sleeve disposed about the coax central conductor and adjacent to the first side, in an extended position the actuating conductive tip extending beyond the dielectric sleeve; and a dielectric disc coupled to the second side of the waveguide probe head, wherein each spring loaded microwave interconnector is configured to establish a signal redirection antenna within the corresponding port of the waveguide assembly.

26. The waveguide to PCB interconnector assembly of claim 25, wherein the matched first and second contours are flat.

27. The waveguide to PCB interconnector assembly of claim 25, wherein the matched first and second contours are curved.

28. The waveguide to PCB interconnector assembly of claim 25, wherein for each spring loaded microwave interconnector, the dielectric disc has a first diameter, the probe head having a second diameter about equal to the first diameter, the dielectric sleeve having an outside diameter greater than the first diameter, and the coax central conductor having a third diameter less than half of the first diameter.

29. The waveguide to PCB interconnector assembly of claim 28, wherein for each spring loaded microwave interconnector, the first diameter and the second diameter are approximately between 0.126 and 0.131 inch, the outside diameter is approximately between 0.128 and 0.132 inch, the conductive tip having a diameter approximately 0.024 inch, the probe head and dielectric disc each having a height of approximately 0.04 inch, the dielectric sleeve having a height of approximately 0.123 inch, the conductive tip extending beyond the dielectric sleeve by approximately 0.02 inch.

30. The waveguide to PCB interconnector assembly of claim 25, wherein each spring loaded microwave interconnector is operable as a 50 ohm transmission line.

31. The waveguide to PCB interconnector assembly of claim 25, wherein the SLMIs provide solderless interconnections between the paired waveguide and PCB ports.

32. The waveguide to PCB interconnector assembly of claim 25, wherein the SLMIs provide compression based interconnections between the paired waveguide and PCB ports.

33. The waveguide to PCB interconnector assembly of claim 25, wherein for each SLMI the spring loaded coax central conductor includes:

a conductive sleeve defining an internal chamber about the central axis and an aperture concentric about the central axis, a spring disposed within the chamber;

the actuating conductive tip having a base and a distal tip disposed within the chamber between the aperture and the spring, the base adjacent to the spring and the distal tip extending through the aperture;

a retainer structured and arranged to retain the actuating conductive tip within the conductive sleeve.

34. The waveguide to PCB interconnector assembly of claim 33, wherein for each spring loaded microwave interconnector, the retainer is a crimp in the conductive sleeve defining the aperture to have a diameter less than a diameter of the chamber.

* * * * *